United States Patent
Wang et al.

(10) Patent No.: US 7,092,534 B2
(45) Date of Patent: Aug. 15, 2006

(54) METHOD AND SYSTEM FOR REDUCING POP NOISE OF A SOUND BROADCASTING INSTRUMENT

(75) Inventors: Yuhe Wang, San Diego, CA (US); Peter P. White, Del Mar, CA (US); Daniel Ho, Palo Alto, CA (US); Frank Nguyen, San Diego, CA (US); Chin-Chi Chang, Fremont, CA (US); Jeetin Rathore, Fremont, CA (US)

(73) Assignee: VIA Telecom Co., Ltd., San Diego, CA (US)

(*) Notice: Subject to any disclaimer, the term of this patent is extended or adjusted under 35 U.S.C. 154(b) by 44 days.

(21) Appl. No.: 10/862,917

(22) Filed: Jun. 7, 2004

(65) Prior Publication Data
US 2005/0195991 A1 Sep. 8, 2005

Related U.S. Application Data

(60) Provisional application No. 60/549,839, filed on Mar. 2, 2004.

(51) Int. Cl.
*H04B 15/00* (2006.01)

(52) U.S. Cl. .......... 381/94.5; 381/123; 381/94.1; 381/120; 330/261; 330/296; 330/51; 330/285

(58) Field of Classification Search .............. 381/94.5, 381/94.1, 123, 93, 120; 330/296, 280, 24.7, 330/261, 51, 285, 10
See application file for complete search history.

(56) References Cited

U.S. PATENT DOCUMENTS

| | | | | |
|---|---|---|---|---|
| 6,157,726 A | * | 12/2000 | Carroll et al. | 381/94.5 |
| 6,600,365 B1 | * | 7/2003 | Frith | 330/51 |
| 2005/0025322 A1 | * | 2/2005 | Henson et al. | 381/120 |

* cited by examiner

*Primary Examiner*—Vivian Chin
*Assistant Examiner*—Justin Michalski
(74) *Attorney, Agent, or Firm*—Preston Gates & Ellis LLP

(57) ABSTRACT

A method and system are disclosed for controlling pop noises in a sound broadcasting system. After controllably connecting an output of a drive amplifier to a first predetermined low voltage level through a first switch, a first portion of an operation control data set is input to a digital-to-analog converter (DAC) circuit for driving an output thereof to a second predetermined low voltage level, and a second portion of the operation control data set is also input to the DAC circuit and further to the drive amplifier to bring the output of the drive amplifier to a common mode voltage level over a predetermined rise-up time period for controlling the pop noises.

39 Claims, 3 Drawing Sheets

METHOD AND SYSTEM FOR REDUCING POP NOISE OF A SOUND BROADCASTING INSTRUMENT

CLAIMED PRIORITY

This application claims the benefits of U.S. Provisional Patent Application Ser. No. 60/549,839, which was filed on Mar. 2, 2004 and entitled "Method and System for Reducing POP Noise of Digital to Analog Converter."

BACKGROUND

The present disclosure relates generally to digital-to-analog converters, and more particularly, to a method and system for reducing or eliminating transient (POP) noise created when a communication instrument or sound broadcasting system is powered on or off.

A typical sound broadcasting system contains an audio amplifier circuit that drives a broadcasting module such as a speaker. During the power-up or power-down phases of an audio amplifier circuit's operation, an abrupt change in the amplifier's output voltage can result in an undesirable POP noise. The POP noise has always been a major issue for any communication devices or systems that use amplifier circuit. These devices can be a mobile phone, home stereo, or any other sound broadcasting instruments that include speaker or microphone. Transient noises can occur during power-up and/or power-down sequences for a device producing a pop or click noise. These undesired noises can be extremely irritating to users and damaging to the device as well. It is of the best interest to provide a solution to eliminate or reduce such noises.

The current available solutions to the problem often require large and expensive parts such as large capacitors and external pads. These capacitors are often large and require an external pin for connection to integrated circuits. Due to this issue, the size and cost of such circuits can increase greatly. While these existing solutions do reduce or prevent POP noise from occurring, there are still needs for simpler and lower cost solutions. Since technology, such as software and microprocessors, continues to grow, cost for implementing such technology to solve the problem of POP noise may be lowered.

It is always desirable for additional flexible and low cost designs that provide the reduction or elimination of POP noises.

SUMMARY

In view of the foregoing, an improved method and system are provided for reducing or eliminating the POP noises in a sound broadcasting system.

In one embodiment, after controllably connecting an output of a drive amplifier to a first predetermined low voltage level through a first switch, a first portion of an operation control data set is input to a digital-to-analog converter (DAC) circuit for driving an output thereof to a second predetermined low voltage level, and a second portion of the operation control data set is also input to the DAC circuit and further to the drive amplifier to bring the output of the drive amplifier to a common mode voltage level over a predetermined rise-up time period for controlling the pop noises. A power-down sequence may also be performed when the sound broadcasting system is to be turned off.

The construction and method of operation of the invention, however, together with additional objects and advantages thereof will be best understood from the following descriptions of specific embodiments when read in connection with the accompanying figures.

DESCRIPTION

The present disclosure provides a method and system for reducing the transient (POP) noise of a sound broadcasting instrument caused by an amplifier circuit during its power-up and/or power-down phase.

In a sound broadcasting system, in order to reduce or eliminate the POP noise during its power-up and power-down sequences, software control and a switch group are implemented with an amplifier circuit integrated with a digital-to-analog converter (DAC). Since the software is used to control the amplifier, implementation of such system is extremely flexible. The cost of the solution can be lowered since it will require no external parts, or large hardware components such as large capacitors.

Figure 1A:
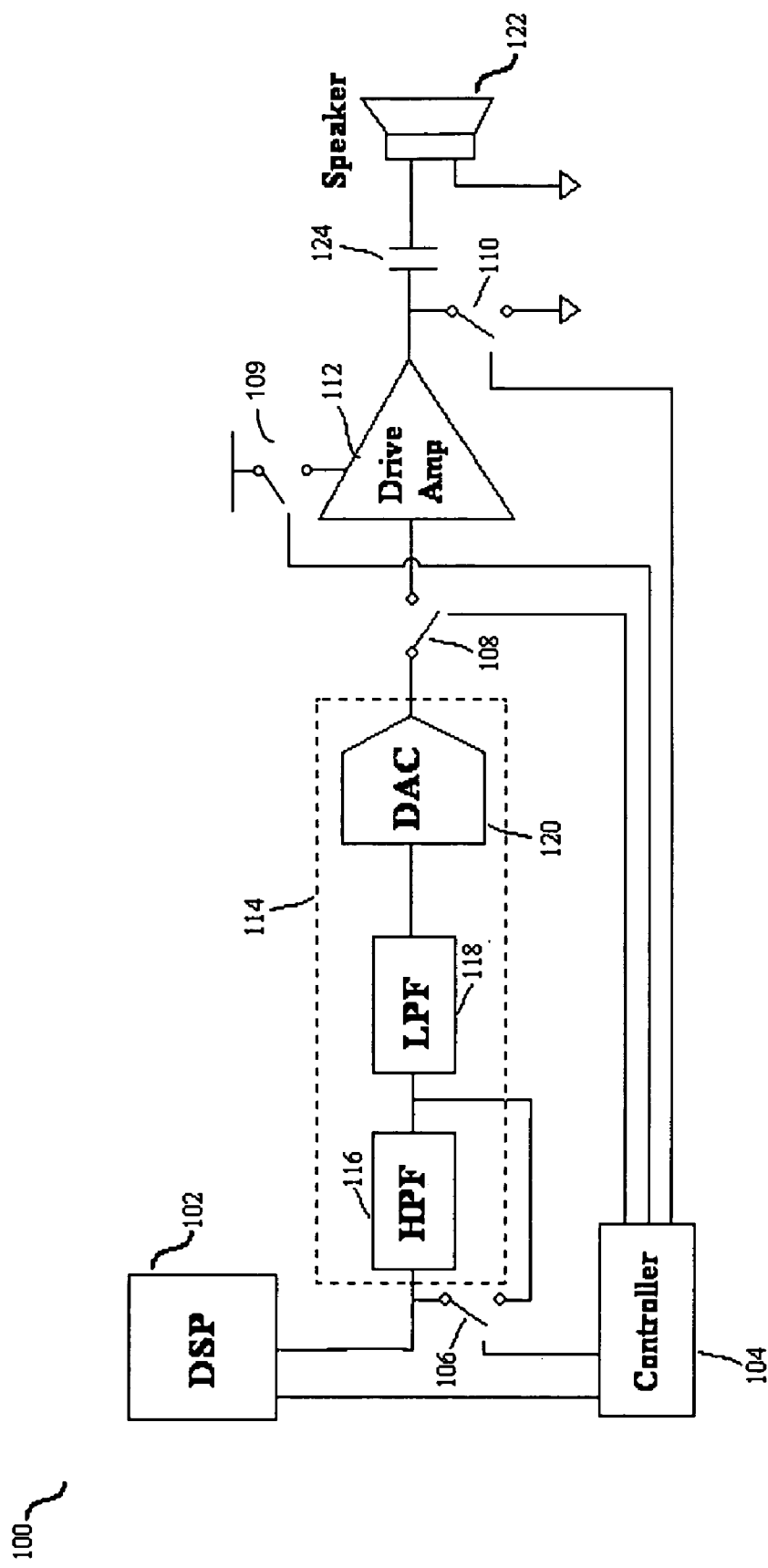
FIG. 1A illustrates a system for reducing POP noise in accordance with one embodiment of the present invention.

FIG. 1A presents a part of a sound broadcasting system 100 for reducing or eliminating POP noise in accordance with one embodiment of the present invention. The system is integrated with components for controlling the abrupt changes of voltage, at the output of a drive amplifier, when the drive amplifier is powered up or down. Various switches are implemented to work with a digital-to-analog converter (DAC) circuit in such a way that it will not cause or reduce any POP noise to the broadcasting module (e.g., a speaker) it drives. Software codes are used flexibly for the power-up or power-down sequence so that it is assured the output of the amplifier is brought to a mid-point between two complimentary voltage supplies (known as a common mode voltage) within a predetermined time period so that the chance to have the POP noise is greatly reduced. A high pass filter of a typical DAC circuit may also be used with a set of switches in order for the system to work smoothly during the power-up and/or power-down sequences since low frequency signals that are needed for the power-up and power-down sequences cannot pass the high pass filter.

It is assumed that an incoming operation control data set (which may also be known as write-in waveform codes representing a particular waveform) needed for the power-up or power-down sequence are provided by a signal processing unit such as a digital signal processor (DSP) 102, which is very common in a sound broadcasting system such as a cell phone. All the switches used in the diagram can be controlled by a controller 104. It is also understood that these switches can be controlled by data dispatched from the DSP as well. Only for the purpose of illustration here, it is assumed that the switches are separately operated by the controller 104, and the operation control data set is provided by the DSP. By sending out predetermined operation control data sets during the power-up/power-down operation, the DSP 102 is able to control the speed of ramping up an output of the amplifier to the common mode voltage, thereby reducing the chance of having the POP noise along with the operation of the controller 104.

Figure 1B:
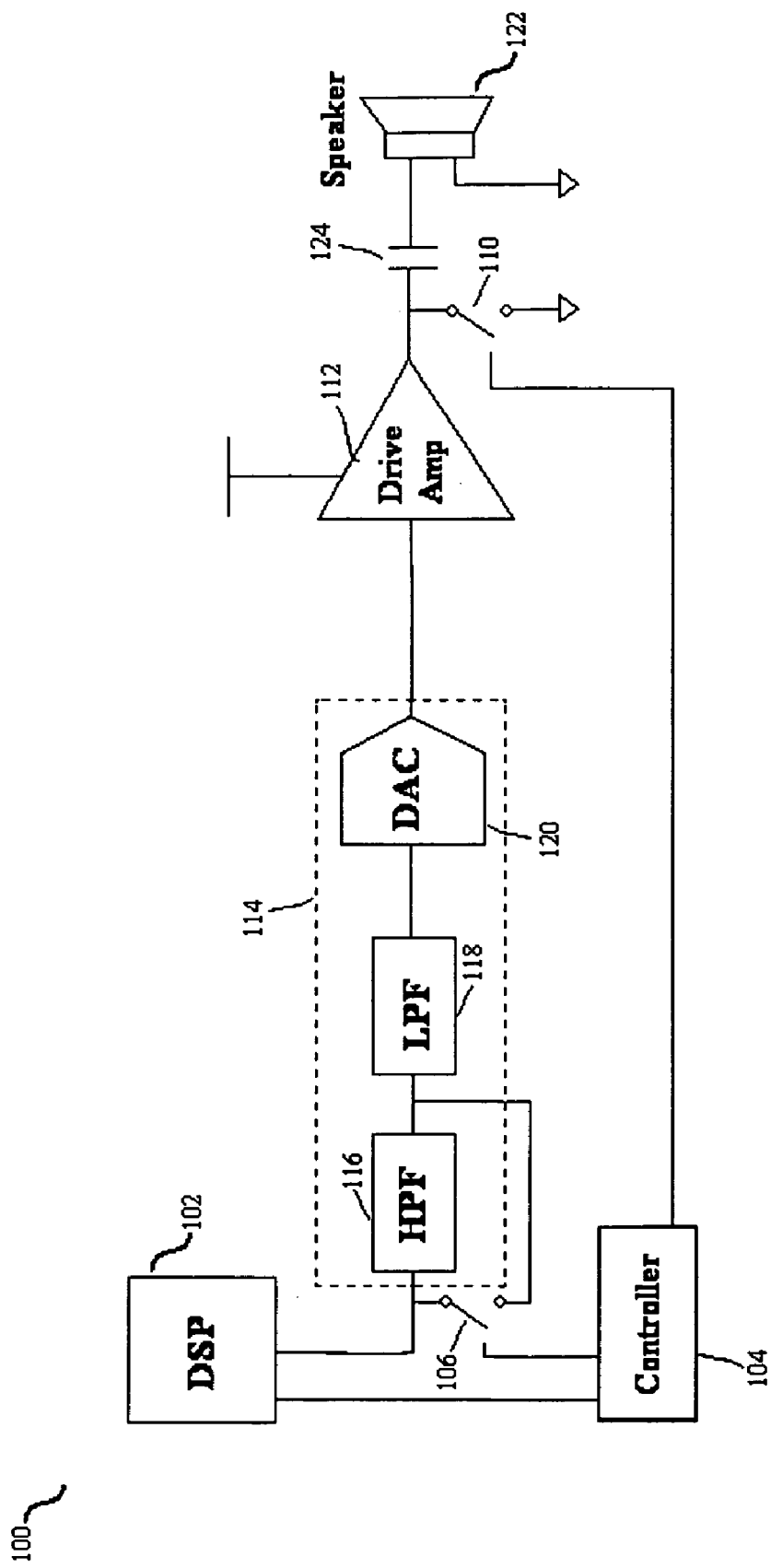
FIG. 1B illustrates a system for reducing POP noise in accordance with another embodiment of the present invention.

As to the switches, there are shown in FIG. 1A four switches in this example: a bypass switch 106, an input switch or isolation switch 108, an amplifier power switch 109, and an output switch 110. These switches are turned on or off at predetermined time periods for the power-up or off sequences. Among the four switches, it is understood that the switches 108 and 109 are optional, but their existence may enhance the performance of the present invention. To view that these two switches 108 and 109 are optional means that these can be replaced by solid connections at all times without any individual control. This alternative embodiment is shown in FIG. 1B, where the connections are permanently made between the output of the DAC module 120 and the input of the amplifier 112, and between a power supply and the drive amplifier.

In this configuration, there is a typical DAC circuit 114, which is used for digital-to-analog data conversion, including a high pass filter 116, a low pass filter 118, and a voice DAC module 120. The DAC circuit 114 can help filter out unwanted noises and decode digital signal into analog signal. Since the initial operation control data sets are relatively low frequency data, the bypass switch 106 is needed to allow the data to bypass the filtering function of the high pass filter 116 so that the problem of the POP noise can be dealt with.

When the sound broadcasting system, such as a cell phone, is initially turned on, a power-up sequence is first brought to act. At the beginning of the power-up sequence for the system, all switches, except the switch 110, are open by default, while the rest of the system is off. The output switch 110 is connected at one end to the output of the amplifier 112, and the other, at the lowest power supply voltage level. It is understood that for the purpose of this application, if the amplifier uses both a positive and negative power supply voltages, the negative power supply voltage is referred to as the lowest power supply voltage. Similarly, when the amplifier uses a positive power supply voltage and zero volt (which is commonly referred as ground) as its supply voltages, the zero volt power supply level or the ground is referred to as the lowest power supply voltage. As it is, the amplifier 112 is isolated from the DAC circuit 114. Then, the drive amplifier 112 is set to its maximum gain. With this configuration, the output of the amplifier 112 reaches to the lowest power supply voltage level within a short period of time.

Once the DAC circuit 114 is turned on, the bypass switch 106 will be closed, thereby allowing an initial operation control data set to bypass the high pass filter 116. The high pass filter 116 is designed to provide low frequency rejection function for the DAC circuit 114 for regular data. Since the initial operation control data set is sent with a low frequency that is not audible to human ears, if the bypass switch 106 is not there, the operation control data set will be rejected altogether at this stage. It is understood that the lowest frequency that human ears can hear is probably around 20 Hz. As such, the frequency of the initial data set can be set somewhere below 5 Hz so that it is assured that the operation of the power-up sequence is completely undetected by the user of the sound broadcasting system 100.

Through the DSP 102, a portion of the operation control data set known as a downward code, or ramp-down code, is sent into the DAC circuit 114. The code or its associated signals bypass the high pass filter through the operation of the bypass switch 106, through the low pass filter 118, and enter into the voice DAC module 120 until the output of the voice DAC module 120 reaches a low voltage level relying on the most negative code (or a code that corresponds to the lowest power supply voltage level) of the downward code. If the isolation switch 108 is implemented, it still stays off at the moment so that the drive amplifier is not interfered by the current operation or "ramp-down operation" of the DAC circuit. Whether the isolation switch 108 is used or not, the input of the drive amplifier 112 is now having a low potential close to or the same as the lowest power supply voltage (which is defined earlier as either ground or the negative power supply voltage). As it can be seen, for further reducing the possibility of having any POP noise or transient noise that becomes detectable at the speaker 122, the isolation switch 108 can isolate the drive amplifier 112 from being physically connected to the voice DAC module 120 until the output of the DAC circuit 114 is ready to operate further. This configuration performs better than the configuration that eliminates the isolation switch 108, as shown in FIG. 1B.

Once the output of the voice DAC module 120 reaches the lowest voltage level, the drive amplifier 112 is turned on by connecting the switch 109. The isolation switch 108 is also closed, thereby allowing the signal to go into the drive amplifier 112.

The drive amplifier 112 is an audio amplifier that amplifies any audio signal, and drives the output to the speaker 122. Since the output of the drive amplifier 112 is driven to the lowest power supply voltage by the output switch 110, which is closed when the drive amplifier 112 is turned on, the drive amplifier 112 would therefore not send any spike of noise, or POP noise, to the speaker 122. To further assure that all POP noises are prohibited from occurring before real communication signals are passed onto the speaker 122, after the power-up sequence, the output switch 110 will remain closed for another short period of time, such as 4 or 5 ms.

After this short period of time, the output switch 110 is opened and disconnected from the lower power supply voltage (either the ground or the negative power supply rail), and another portion of the operation control data set, known as the ramp-up code, will be sent in from the DSP 102 to bring the output of the amplifier 112 to the common mode voltage with a controlled fashion or a predetermined time period so that the POP noise is avoided. Taking a cell phone for example, the operation supply voltage may swing between 0 and 3.0 volts, and the common mode voltage may be aimed at one half of the total swing, i.e., 1.5 V for this example.

This ramp-up code represents a waveform such as a linear wave which will slowly rise up over a period of time which may last longer than 300 ms in some preferred embodiments. At the end of this waveform, the output of the drive amplifier 112 is at, or around, the common mode voltage thereof. This marks the end of the power-up sequence, and the normal operation of the sound broadcasting system 100 can follow. The waveform used for the sound broadcasting system can be flexible in design. For example, a quarter of a sine wave (e.g., the rising first quarter of a sine wave) can also be used for the ramp-up code, as long as it corresponds to a non-audible low frequency so that the power-up sequence is totally undetected by a user. As it is mentioned above, while it is already very rare for the human ears to hear frequencies around 20 Hz, if the sine wave is at a frequency of 1 Hz, which is far apart from 20 Hz, it is guaranteed that the power-up sequence will not be detected. It is further understood that the ramp-up code is to drive an output of the amplifier to the common mode voltage, there can be all kinds of variations as long as it meets to basic requirements, i.e., it makes the output of the amplifier reach the common mode voltage and it is associated with a humanly non-detectable frequency that will not cause any POP noise to the speaker.

For example, a combination of a linear wave and a cosine wave can be used as another variation. The initial low slope ramp-up linear portion enables the DAC circuit 114 to leave saturation gracefully without exact knowledge of the DAC conversion gain, thereby allowing for tolerance in the analog gain. Once the output of the amplifier has entered the linear region (for the worst case tolerance), the waveform is changed to a raised cosine, which minimizes audible noise while bringing the output of the amplifier to the common mode voltage as quickly as possible. The transition of the signals is created so that the curve is continuous, and has no (audible) high frequency components. As it is understood, the operation control data set can be programmed in various ways and this control by software affords flexibility. For example, the frequencies associated therewith can vary as well as the length of the waveform as long as it serves the purpose of driving the output of the amplifier to the common mode voltage.

When the sound broadcasting system 100 is in its normal operation, the communication signals such as the voice communication signals can then be broadcast through the speaker 122, after passing through a typical AC coupling capacitor 124. The AC coupling capacitor 124 usually comes along with a speaker, and is used to filter extra noises from certain frequencies, depending on the value of the capacitor. It is understood that as soon as the ramp-up code is completed, the system 100 needs to switch off the bypass switch 106, which is opened up to allow the normal communication signals having relatively high frequencies to pass the high pass filter 116.

The POP noises can also occur during the power-down sequence of the system. The power-down sequence begins by closing the switch 106 to again bypass the high pass filter 116. Then a ramp-down code is sent through the low pass filter 118, into the voice DAC module 120, and eventually through the drive amplifier 112 to ramp down the output of the drive amplifier to its lowest level (either the ground or the negative power supply voltage) without causing any transient noises from occurring.

The drive amplifier 112 is then driven to the lowest power supply voltage level by closing the output switch 110, thereby allowing all noises, including any potential POP noises, to bypass to the lowest power supply voltage (either ground or the negative power supply rail) rather than to the speaker 122. The isolation switch 108 is then opened to stop any signal from entering the drive amplifier 112. At this point, all circuit components can be turned off safely without causing any POP noise. Similar to the power-up sequence, the isolation switch 108 can be optionally replaced by a steady connection.

Figure 2:
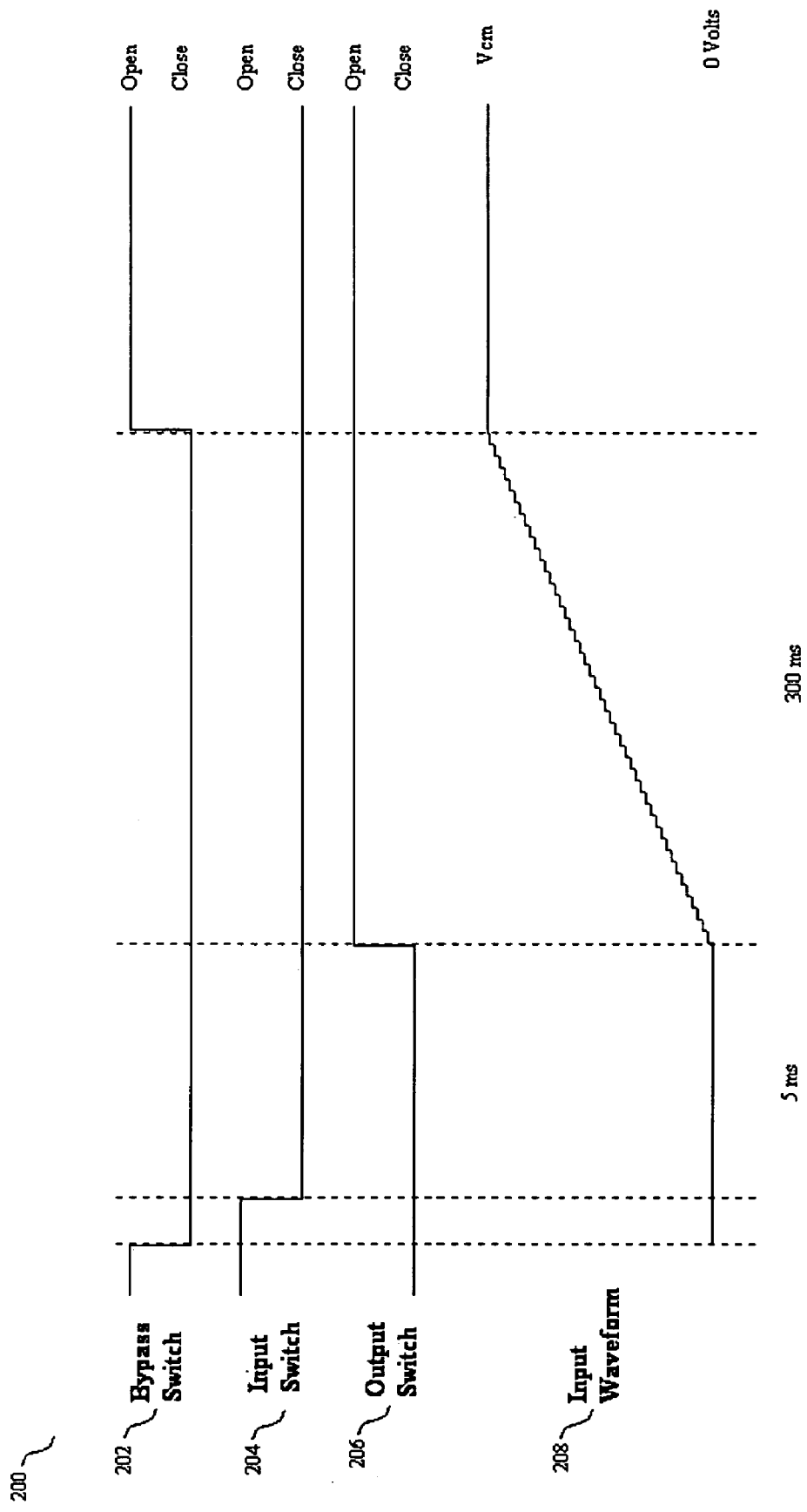
FIG. 2 illustrates an input waveform and switch control signals outputted from a DSP over time in accordance with one embodiment of the present invention.

FIG. 2 presents a FIG. 200 including input signals provided by the DSP 102 to the system at different stages of the operation, and signals controlling the operation of the switches by the controller 104 during the power-up sequence in accordance with the above described embodiment of the present invention. The control signals 202, 204 and 206 are sent either by the controller 104, the digital processor 102, or a combination of both to control the switches.

In this FIG. 2, it is assumed that any switch may be opened when the corresponding control signal is high, while the same switch may be closed when the signal is low. The control signal 202 is sent to the bypass switch 106. Since the bypass switch 106 is opened by default, one of the first commands of the power-up sequence is to close it, thereby allowing the low frequency signal to bypass the high pass filter 116. As shown in the signal 202, the bypass switch 106 is not opened until normal operation after the ramp-up code. The control signal 204 shows that the isolation switch 108 is initially open in the early stage of the sequence after the high pass filter 116 is bypassed and the amplifier is turned on. The signal 206 controls the output switch 110. As mentioned above, as the drive amplifier 112 powers on and the isolation switch 108 is closed, the output switch 110 still requires a short period of time, such as 5 ms, before it is re-opened. The signal 206 shows that the output switch 110 is initially closed by default and is opened after 5 ms, after the isolation switch 108 is closed.

The signal 208 is a waveform associated with the operation control data set that is sent into the system during the power-up sequence. This waveform allows a smooth and relatively slow transition without causing the POP noises. As illustrated above, for example, the output of the drive amplifier 112 is initially driven to the lowest power supply voltage level before the isolation switch 108 is closed. This means that the input of the drive amplifier 112 would need to be as low as possible before the isolation switch 108 is closed. The DSP 102, in this case, would send a negative code for the input of the drive amplifier 112, as shown in the signal 208, until the output switch 110 is opened by the signal 206. To avoid any extra transient noises, the DSP 102 is also required to send in a ramp-up code, thereby allowing the data signal to be brought up slowly over time. For the purpose of illustration, the time it takes to bring the output of the voice DAC module 120 to the common mode voltage for this example is about 300 ms. Once the power-up sequence is ended, the regular high frequency communication signals are expected to pass through the high pass filter 116 with the bypass switch turned open again.

The above described invention needs no external components to be added for using the typical DAC and amplifier. The software controlled operation control data set affords more flexible operations of the amplifier while reducing the POP noise. As seen above, the time constant for the rise and fall for the common mode voltage is controlled by digital data instead of a large external bypass capacitor, which also provides programming flexibility. In some examples, on-chip semiconductor switches can be used, and a pre-stored waveform can also be used for the power-up or power-down sequence. The switching of the switches is flexibly controlled by a separate controller, other signal processors such as the DSP, or both. The cost for implementing this invention is also very low since it only requires adding switches to a normal amplifier circuit and storing small amounts of data required for generating the waveforms.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design and method for reducing or eliminating the POP noises, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A method for controlling pop noises in a sound broadcasting system, the method comprising:
   controllably connecting an output of a drive amplifier to a first predetermined low voltage Level though a first switch;
   inputting a first portion of an operation control data set to a digital-to-analog converter (DAC) circuit for driving an output thereof to a second predetermined low voltage level; and
   inputting a second portion of the operation control data set to the DAC circuit and further to the drive amplifier to bring the output of the drive amplifier to a common mode voltage level over a predetermined rise-up time period for controlling the pop noises,
   wherein the inputting the first portion of the operation control data set further includes disconnecting the first switch after a predetermined period of time after the output of the DAC circuit is driven to the second predetermined low voltage level.

2. The method of claim 1 wherein the predetermined period of time is less than 5 ms.

3. The method of claim 1 wherein the controllably connecting further includes setting the drive amplifier to its maximum gain.

4. The method of claim 1 wherein the inputting the first portion further includes turning on the DAC circuit before inputting.

5. The method of claim 4 wherein the inputting the first portion further includes isolating the output of the DAC circuit from the drive amplifier through a second switch before the DAC circuit is turned on.

6. The method of claim 1 further comprising bypassing a high pass filter contained in the DAC circuit for delivering the operation control data set.

7. The method of claim 6 wherein the bypassing is performed by controlling a bypass switch.

8. The method of claim 1 further comprising turning on the drive amplifier by connecting a third switch before inputting the second portion of the operation control data set.

9. The method of claim 1 wherein the first and second predetermined low voltage levels are the same.

10. The method of claim 9 wherein the first and second predetermined low voltage levels are the lowest power supply voltage.

11. The method of claim 1 wherein the predetermined rise-up time period is longer than 300 ms.

12. The method of claim 1 wherein the operation control data set is associated with at least one low frequency that is not audible by human ears.

13. The method of claim 12 wherein the second portion of the operation control data set represents a linear wave.

14. The method of claim 12 wherein the second portion of the operation control data set represents a portion of a sine wave.

15. The method of claim 1 wherein the low frequency is below 5 Hz.

16. The method of claim 1 further comprising performing a normal operation after the output of the drive amplifier has reached the common mode voltage level.

17. The method of claim 1 further comprising performing a power-down sequence when the broadcasting system is to be turned off.

18. The method of claim 17 wherein the performing further includes:
   sending a third portion of the operation control data set associated with a non-audible frequency to the DAC circuit for driving down the output of the drive amplifier to a third predetermined low voltage level;
   controllably connecting the output of the drive amplifier to the first predetermined low voltage level through the first switch; and
   turning off the sound broadcasting system.

19. The method of claim 18 further comprising isolating the drive amplifier from the DAC circuit before turning off the sound broadcasting system.

20. A sound broadcasting system comprising:
   a digital-to-analog converter (DAC) circuit for receiving at least one operation control data set;
   a drive amplifier driven by the DAC circuit with its output controllably connectable to a first predetermined low voltage level through a first switch during a predetermined time period within a power-up or power-down sequence;
   a broadcasting module driven by the drive amplifier; and
   an isolation switch coupled between the output of the DAC circuit and an input of the drive amplifier for isolating the drive amplifier until the DAC circuit is driven to a second predetermined low voltage level,
   wherein a first portion of the operation control data set drives an output of the DAC circuit to a the second predetermined low voltage level and a second portion of the operation control data set brings the output of the drive amplifier to a common mode voltage level over a predetermined rise-up time period for controlling undesired pop noises transmitted by the broadcasting module.

21. The system of claim 20 further comprising a bypass switch for bypassing a high pass filter contained in the DAC circuit for delivering the operation control data set.

22. The system of claim 20 further comprising a second switch for turning on the drive amplifier by connecting it to a power supply.

23. The system of claim 20 wherein the first and second predetermined low voltage levels are the same.

24. The system of claim 20 wherein the first and second predetermined low voltage levels are the lowest power supply voltage.

25. The system of claim 20 wherein the predetermined rise-up time period is longer than 300 ms.

26. The system of claim 20 wherein the operation control data set is associated with at least one low frequency that is not audible by human ears.

27. The system of claim 26 wherein the low frequency is below 5 Hz.

28. The system of claim 20 wherein the operation control data set is provided by a digital signal processor.

29. The system of claim 20 wherein the switches are controlled by a controller, a digital signal processor, or a combination thereof.

30. A method for controlling pop noises in a sound broadcasting system, the method comprising:
   controllably connecting an output of a drive amplifier to a first predetermined low voltage level through a first switch while isolating the drive amplifier from a digital-to-analog converter (DAC) circuit by a second switch;
   inputting a first portion of an operation control data set to the DAC circuit for driving an output thereof to a second predetermined low voltage level;
   connecting the DAC circuit to the drive amplifier through the second switch; and inputting a second portion of the operation control data set to the DAC circuit and the drive amplifier to bring the output of the drive amplifier to a common mode voltage level over a predetermined rise-up time period for controlling the pop noises, wherein the inputting the first portion of the operation control data set further includes disconnecting the first switch after a predetermined period of time after the output of the DAC circuit is driven to the second predetermined low voltage level.

31. The method of claim 30 further comprising bypassing a high pass filter contained in the DAC circuit through a bypass switch for delivering the operation control data set.

32. The method of claim 30 further comprising turning on the drive amplifier by connecting a third switch before inputting the second portion of the operation control data set.

33. The method of claim 30 wherein the first and second predetermined low voltage levels are the lowest power supply voltage.

34. The method of claim 30 wherein the predetermined rise-up time period is longer than 300 ms.

35. The method of claim 30 wherein the operation control data set is associated with at least one low frequency that is not audible by human ears.

36. The method of claim 35 wherein the low frequency is below 5 Hz.

37. The method of claim 30 further comprising:

performing a normal operation after the output of the drive amplifier has reached the common mode voltage level; and performing a power-down sequence when the broadcasting system is to be turned off.

38. The method of claim 37 wherein the performing the power-down sequence further includes:

sending a third portion of the operation control data set associated with a non-audible frequency to the DAC circuit for driving down the output of the drive amplifier to a third predetermined low voltage level;

controllably connecting the output of the drive amplifier to the first predetermined low voltage level through the first switch; and turning off the sound broadcasting system.

39. The method of claim 38 further comprising isolating the drive amplifier from the DAC circuit before turning off the sound broadcasting system.

* * * * *